United States Patent
Park

(10) Patent No.: US 6,875,680 B1
(45) Date of Patent: Apr. 5, 2005

(54) METHODS OF MANUFACTURING TRANSISTORS USING DUMMY GATE PATTERNS

(75) Inventor: Cheolsoo Park, Seoul (KR)

(73) Assignee: Dongbu Electronics Co. Ltd., Seoul (KR)

(*) Notice: Subject to any disclaimer, the term of this patent is extended or adjusted under 35 U.S.C. 154(b) by 0 days.

(21) Appl. No.: 10/748,025

(22) Filed: Dec. 30, 2003

(30) Foreign Application Priority Data

Dec. 30, 2003 (KR) .................... 10-2003-0086391

(51) Int. Cl.[7] .......................................... H01L 21/3205
(52) U.S. Cl. .................. 438/595; 438/296; 438/301
(58) Field of Search ................... 438/595, 296, 438/301

(56) References Cited

U.S. PATENT DOCUMENTS 6,054,355 A * 4/2000 Inumiya et al. ............. 438/296
6,251,763 B1 * 6/2001 Inumiya et al. ............. 438/595

* cited by examiner

*Primary Examiner*—Luan Thai
(74) *Attorney, Agent, or Firm*—Hanley, Flight & Zimmerman, LLC

(57) ABSTRACT

Example methods of manufacturing a transistor using a dummy gate pattern are disclosed. A local channel is formed by local channel implantation using the dummy gate pattern after a source and a drain are formed so that a short channel effect can be minimized and a reverse SCE can be reduced.

8 Claims, 7 Drawing Sheets

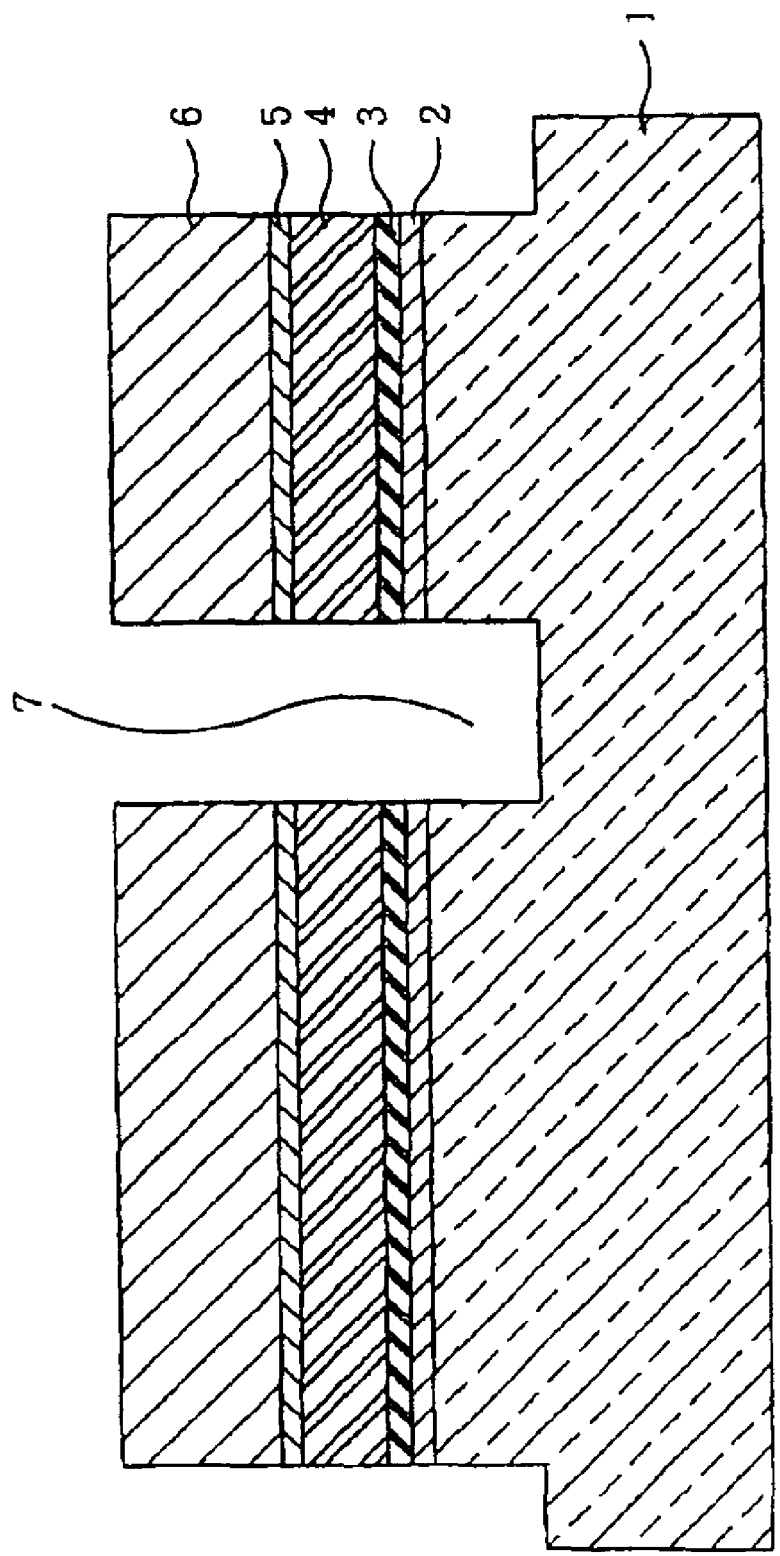

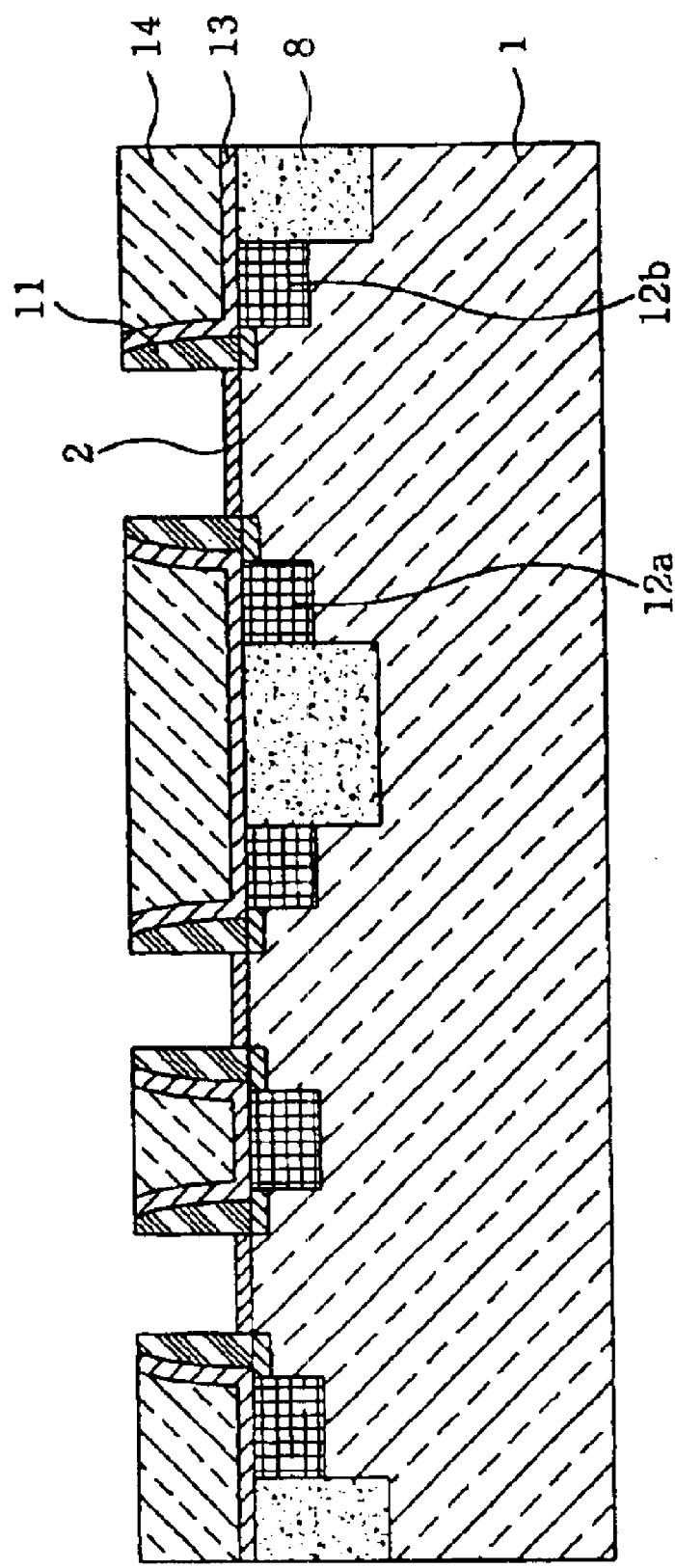

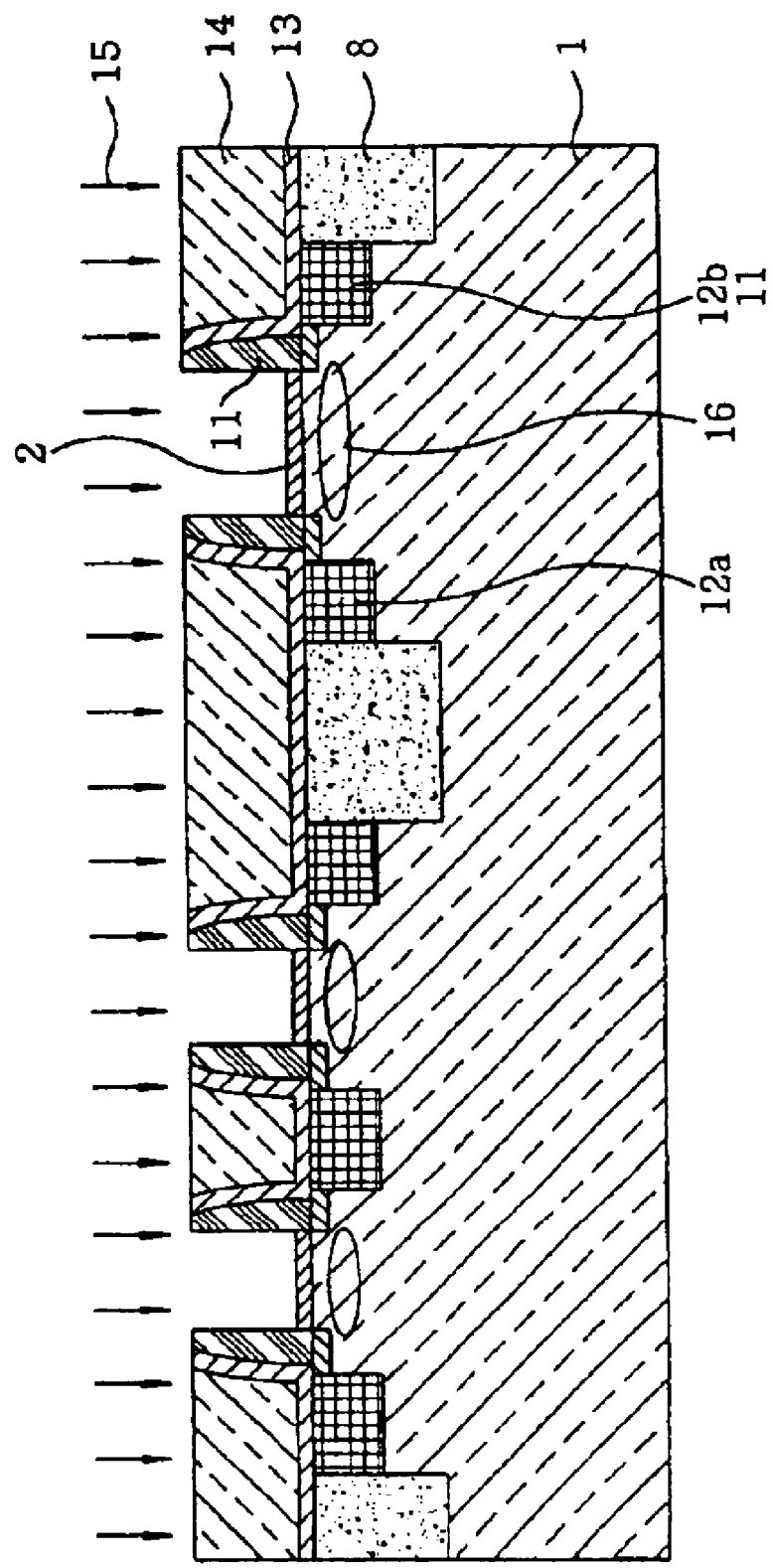

METHODS OF MANUFACTURING TRANSISTORS USING DUMMY GATE PATTERNS

TECHNICAL FIELD

The present invention relates to transistors and, more particularly, methods of manufacturing transistors using dummy gate patterns.

BACKGROUND

Generally, as a level of integration of a semiconductor device increases, there are serious disturbing factors that occur during semiconductor device manufacturing. One of the disturbing factors is a divot of a shallow trench isolation (STI), which affects characteristics of a transistor having a narrow width. Another disturbing factor is a capability of a lithography at side wall of CoO.

BRIEF DESCRIPTION OF THE DRAWINGS

FIGS. 1A to 1G are schematic diagrams illustrating the results of an example transistor manufacturing process.

DETAILED DESCRIPTION

Figure 1B:
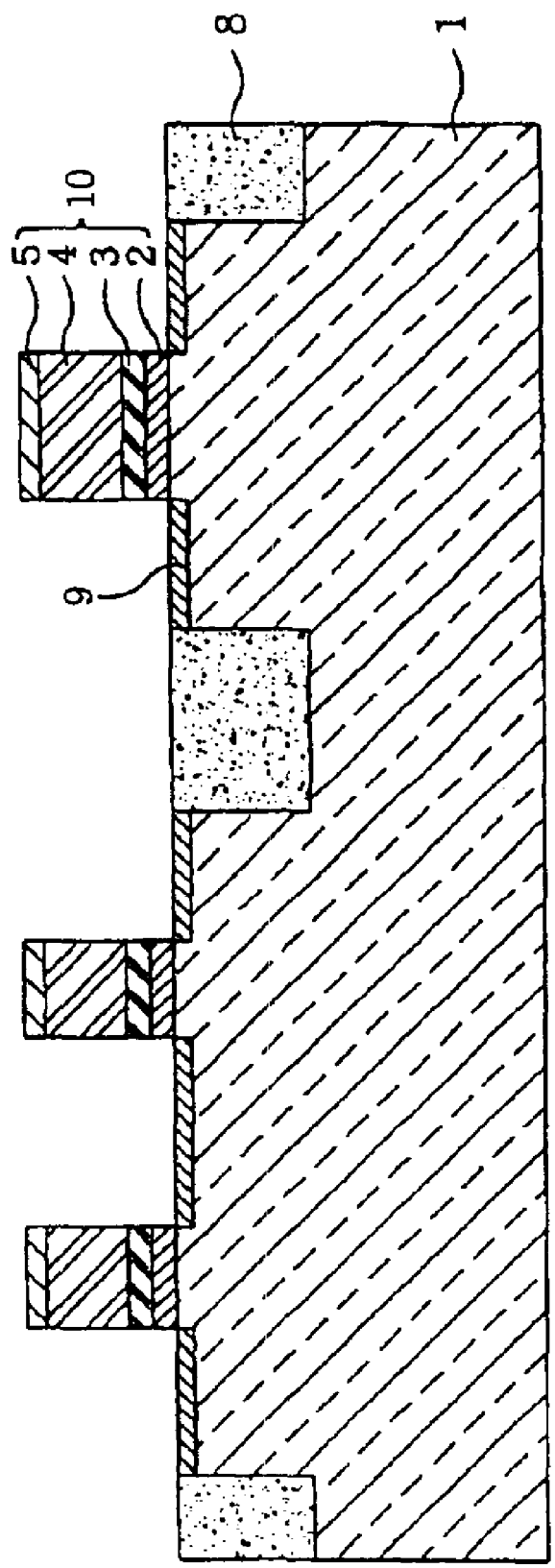

FIGS. 1A to 1G are schematic diagrams illustrating the results of an example transistor manufacturing process.

Referring to FIG. 1A, a first oxide layer 2, a first nitride layer 3, a second oxide layer 4, and a second nitride layer 5 are sequentially formed on a silicon substrate 1. Next, a first photoresist layer 6 is selectively formed on the second nitride layer 5. The first and the second oxide layer 2 and 4, the first and the second nitride layer 3 and 5 and the silicon substrate 1 are etched away through an etching process, e.g., a dry etching, to thereby form a trench region 7 having a predetermined depth.

As shown in FIG. 1B, the first photoresist layer 6 is stripped away and then an insulation layer 8, e.g., a third oxide layer, is deposited on the second nitride 5 and the trench region 7. Next, the insulation layer 8 is planarized through a chemical mechanical polishing (CMP) process. At this time, the second nitride layer 5 acts as a stopper of the CMP process. A second photoresist layer is deposited on the planarized insulation layer 8 and then patterned. Next, portions of the first and the second oxide layer 2 and 4 and the first and the second nitride layer 3 and 5 are etched away based on the patterned second photoresist layer through a dry etching to thereby form a dummy gate pattern 10 at a gate region. Thereafter, a lightly doped drain (LDD) 9 is formed underneath both sides of the dummy gate pattern 10 in the substrate 1 and then the second nitride layer 5 is removed.

Figure 1C:
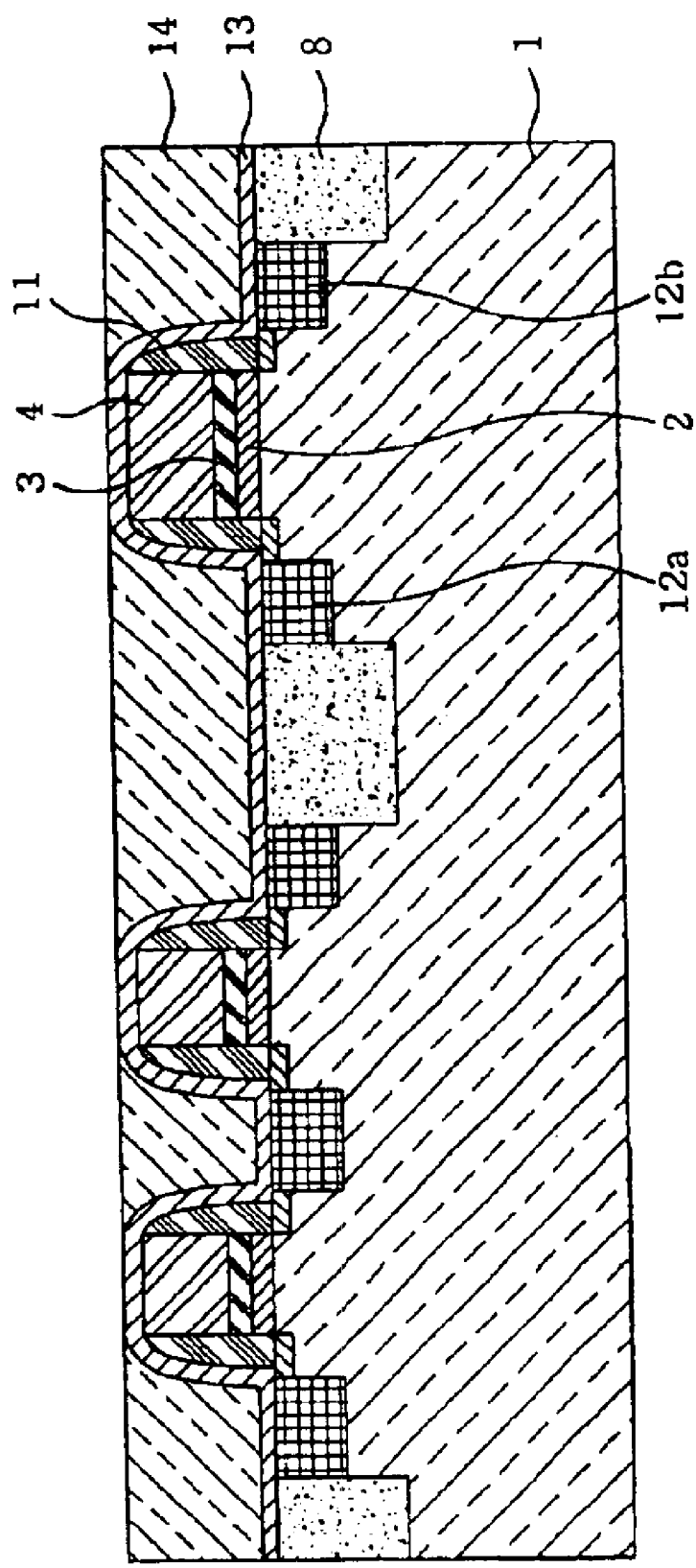

Referring to FIG. 1C, a third nitride layer 11, i.e., a spacer is formed on each sidewall of the dummy gate pattern 10. Thereafter, a source 12a and a drain 12b are formed at a source and a drain region of the substrate 1, respectively, and then a fourth nitride layer 13 having a thickness of hundreds of angstrom is deposited on the first insulation layer 8, the source and the drain 12a and 12b, the second oxide layer 4 and the spacer 11. A second insulation layer 14 is formed on the fourth nitride layer 13 and then planarized through the CMP process. At this time, the fourth nitride layer 13 acts as the stopper of the CMP process so that a portion of the fourth nitride layer 13 deposited on the second oxide layer 4 may be exposed.

Figure 1D:
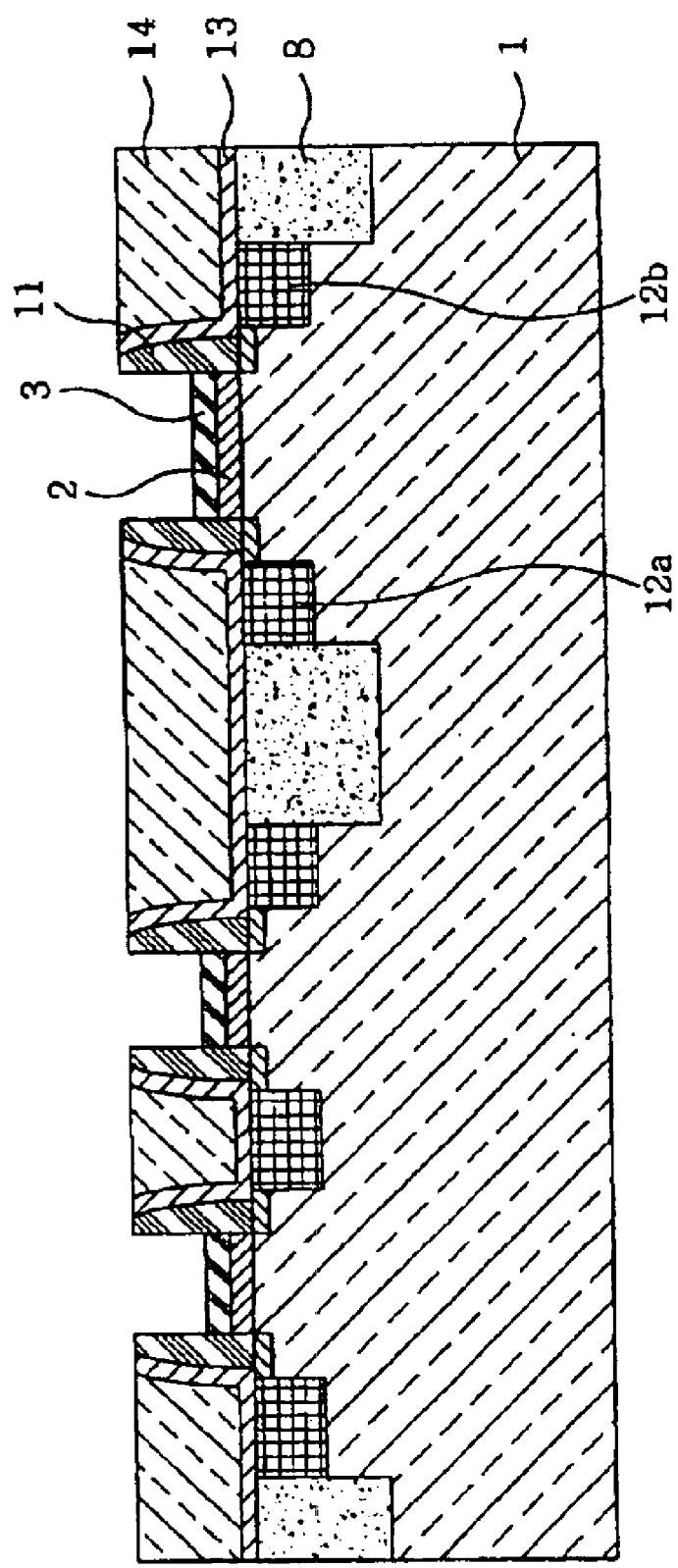

As shown in FIG. 1D, the exposed portion of the fourth nitride layer 13 is removed. The second oxide layer 4 is removed through an etching process so that the first nitride layer 3 may be exposed. In one example, an etching selectivity of the second oxide layer 4 to the second insulation layer 14 in this case is about equal to or greater than 20.

Next, the exposed first nitride layer 3 is etched back as shown in FIG. 1E.

Referring to FIG. 1F, a local channel implantation 15 is performed into the substrate to thereby form a local channel region 16 at the gate region of the substrate 1. By doing this, a lateral diffusion of the source/drain can be reduced and, therefore, a junction depth thereof can be reduced. Also, an edge junction of the gate can be shallower to thereby reduce a junction leakage of n+/p and p+/n and enhance a short channel effect (SCE).

Figure 1G:
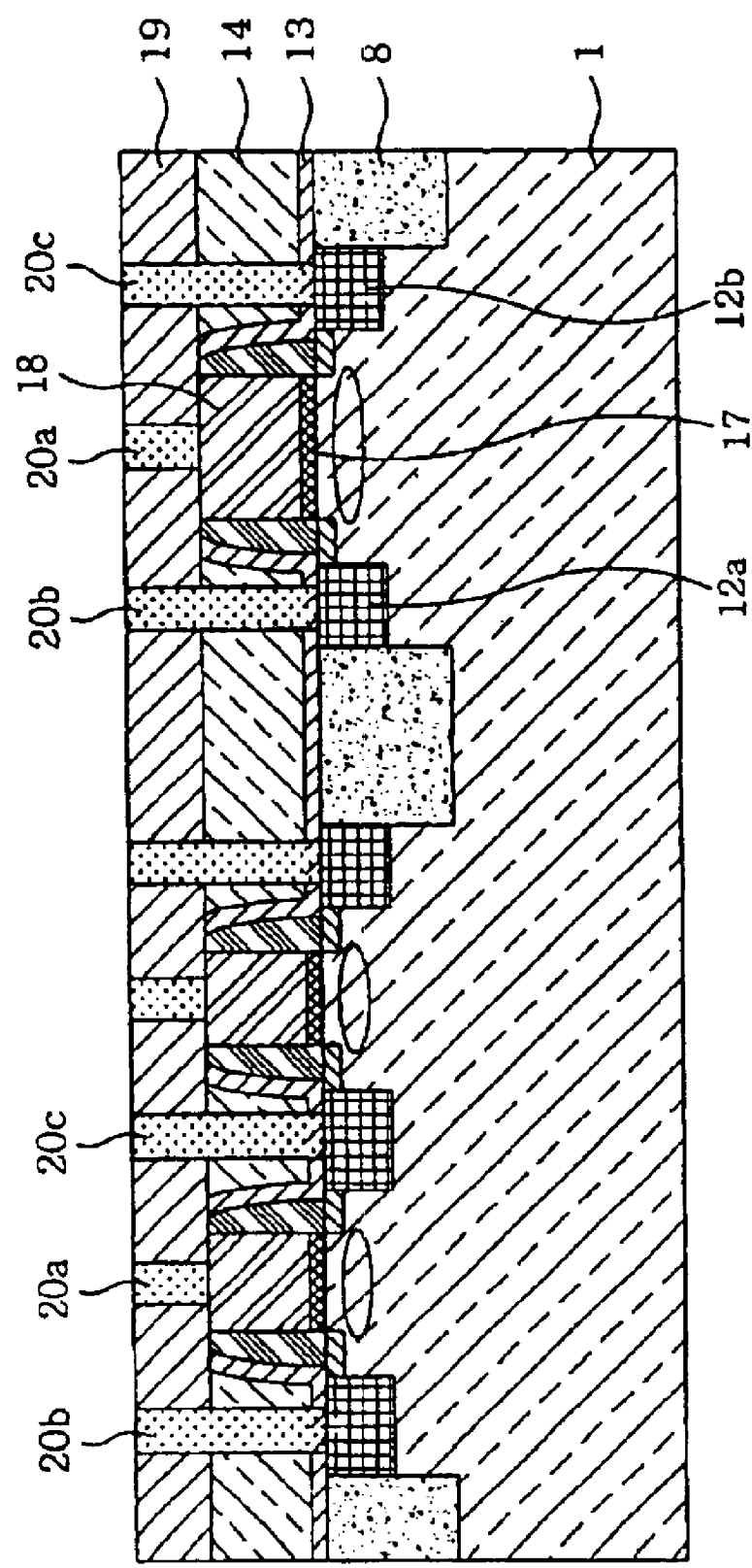

Referring to FIG. 1G, the first oxide layer 2 in the gate region is removed and then a third insulation layer 17 is grown thereto. Next, a conducting material is filled up to the surface of the second insulation layer 14 so that a gate electrode 18 is formed in the gate; region. A fourth insulation layer 19 is deposited on the gate electrode 18 and the second insulation layer 14 and then planarized. Finally, a gate plug 20a, a source plug 20b and a drain plug 20c are formed at the gate region, the source region and the drain region, respectively.

As described above, the local channel is formed by local channel implantation using the dummy gate pattern after the source and the drain are formed so that the SCE can be minimized and a reverse SCE can be reduced. In an alternative example, the first nitride layer 3 can be omitted.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of manufacturing a transistor using a dummy gate pattern, the method comprising:

sequentially depositing on a substrate a first oxide layer, a first nitride layer, a second oxide layer, a second nitride layer;

forming a trench region by etching said second nitride layer, said second oxide layer, said first nitride layer, said first oxide layer and said substrate;

depositing a first insulation layer on said second nitride layer and said trench region;

planarizing said first insulation layer up to said second nitride layer;

forming a dummy gate pattern by etching said second nitride layer, said second oxide layer, said first nitride layer;

forming a lightly doped drain (LDD) underneath both sides of said dummy gate pattern in said substrate and depositing a third nitride layer at both sides of said dummy gate pattern;

removing said second nitride layer;

forming a source and a drain underneath both sides of said dummy gate pattern in said substrate;

depositing a fourth nitride layer and a second insulation layer thereon;

planarizing said second insulation layer up to said fourth nitride layer on said dummy gate pattern;

removing an exposed portion of said fourth nitride layer, said second oxide layer, and said first nitride layer in said dummy gate pattern;

performing a local channel implantation to form a local channel region in said substrate;

removing said first oxide layer in said dummy gate pattern and growing a third insulation thereto;

forming a gate electrode in said dummy gate pattern.

2. A method as defined by claim 1, further comprising depositing a fourth insulation layer on said gate electrode and said second insulation layer then forming plug after forming said gate electrode.

3. A method as defined by claim 1, wherein planarizing is performed through a chemical mechanical polishing, respectively.

4. A method as defined by claim 1, wherein the second oxide layer is etched away using a wet etching.

5. A method as defined by claim 1, further comprising depositing a fourth insulation layer on said gate electrode and said second insulation layer then forming plug after forming said gate electrode.

6. A method of manufacturing a transistor using a dummy gate pattern, the method comprising:

sequentially depositing on a substrate a first oxide layer, a second oxide layer, a first nitride layer;

forming a trench region by etching said first nitride layer, said second oxide layer, said first oxide layer and said substrate;

depositing a first insulation layer on said first nitride layer and said trench region;

planarizing said first insulation layer up to said first nitride layer;

forming a dummy gate pattern by etching said first nitride, said second oxide layer and said first oxide layer;

forming a lightly doped drain (LDD) underneath both sides of said dummy gate pattern in said substrate and depositing a second nitride layer at both sides of the dummy gate pattern;

forming a source and a drain underneath both sides of said dummy gate pattern in said substrate;

depositing a third nitride layer and a second insulation layer thereon;

planarizing said second insulation layer up to said third nitride layer on said dummy gate pattern;

removing an exposed portion of said third nitride layer, said second oxide layer in said dummy gate pattern;

performing a local channel implantation to form a local channel region in said substrate;

removing said first oxide layer in said dummy gate pattern and growing a third insulation thereto;

forming a gate electrode in the dummy gate pattern.

7. A method as defined by claim 6, wherein planarizing is performed through a chemical mechanical polishing, respectively.

8. A method as defined by claim 6, wherein the second oxide layer is etched away using a wet etching.

* * * * *